United States Patent [19]
Beland et al.

[11] Patent Number: 5,140,395
[45] Date of Patent: Aug. 18, 1992

[54] X-RAY SENSOR ARRAYS

[75] Inventors: Robert Beland, Bellefeuille; Yves Chartier, St-Eustache, both of Canada

[73] Assignee: Electromed International Ltd., St-Eustache, Canada

[21] Appl. No.: 632,069

[22] Filed: Dec. 21, 1990

Related U.S. Application Data

[62] Division of Ser. No. 503,884, Apr. 3, 1990.

[51] Int. Cl.⁵ .................. H01L 27/14; H01L 31/10
[52] U.S. Cl. ......................... 357/29; 357/30; 357/32; 357/74; 250/370.01; 250/370.09; 250/370.14
[58] Field of Search ............. 357/29, 30, 32, 74; 250/370.01, 370.09, 370.14

[56] References Cited

U.S. PATENT DOCUMENTS

| | | |
|---|---|---|
| Re. 32,164 | 5/1986 | Kruger . |
| 3,937,965 | 2/1976 | Vasseur . |
| 4,064,440 | 12/1977 | Roder . |
| 4,075,492 | 2/1978 | Boyd et al. . |
| 4,153,839 | 5/1979 | Hounsfield et al. . |
| 4,160,167 | 7/1979 | Weiss et al. . |
| 4,181,856 | 1/1980 | Bone . |
| 4,366,382 | 12/1982 | Kotowski . |
| 4,426,721 | 1/1984 | Wang . |
| 4,430,568 | 2/1984 | Yoshida et al. . |
| 4,484,340 | 11/1984 | Yamaguchi et al. . |
| 4,504,962 | 3/1985 | Moore . |
| 4,535,243 | 8/1985 | Peschmann . |
| 4,542,519 | 9/1985 | Sugimoto . |
| 4,543,490 | 9/1985 | Gupta . |
| 4,583,240 | 4/1986 | Gatten et al. . |
| 4,658,281 | 4/1987 | Sevenhans et al. ............. 357/29 |
| 4,665,283 | 5/1987 | Kable et al. . |
| 4,695,716 | 9/1987 | Tandon et al. ................. 357/30 |
| 4,860,075 | 8/1989 | Araghi et al. ................. 357/30 |
| 4,987,477 | 1/1991 | Ikeno ............................ 357/74 |

FOREIGN PATENT DOCUMENTS 1090482 11/1980 Canada .

Primary Examiner—Jerome Jackson, Jr.
Attorney, Agent, or Firm—Chilton, Alix & Van Kirk

[57] ABSTRACT

A plurality of phototransistors are connected in a matrix of rows and columns. Light falling on the phototransistors discharges the interelectrode capacitance between the emitter and collector of each phototransistor. Each phototransistor is permitted to discharge for a given period of time. A current source then charges the interelectrode capacitance back to its original level. The amount of time taken to recharge the interelectrode capacitance is a function of the intensity of the light falling on that phototransistor.

4 Claims, 10 Drawing Sheets

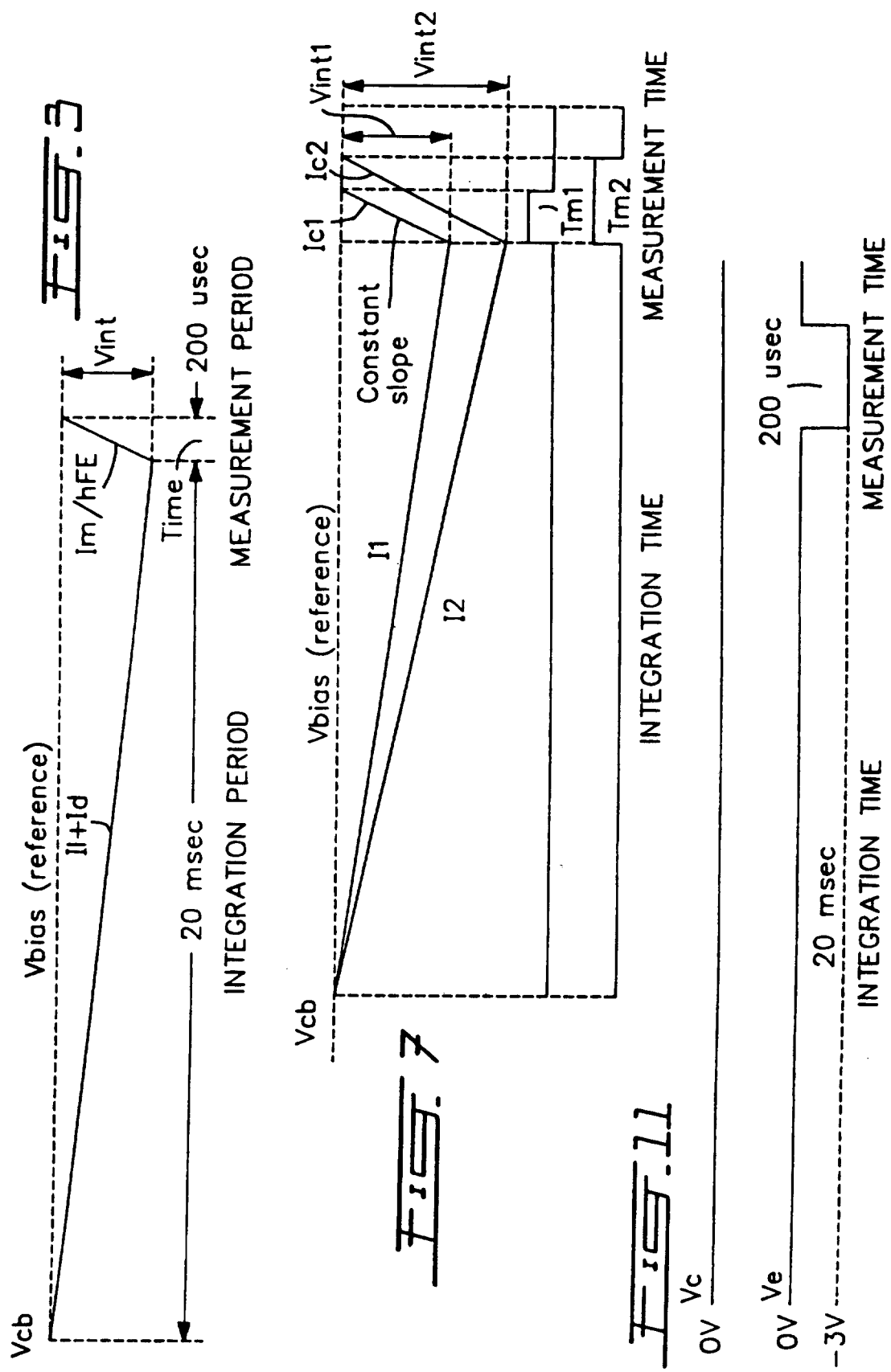

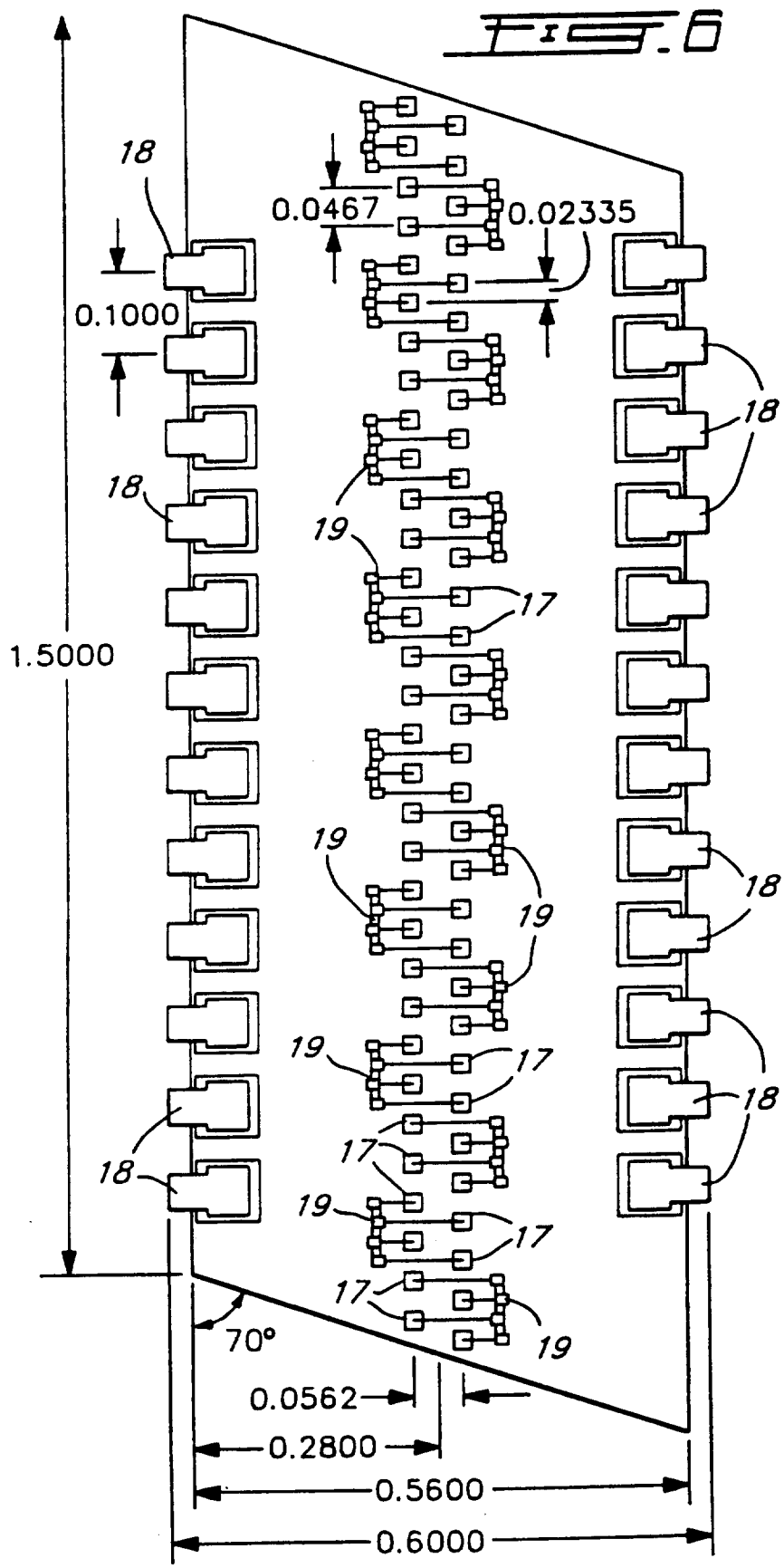

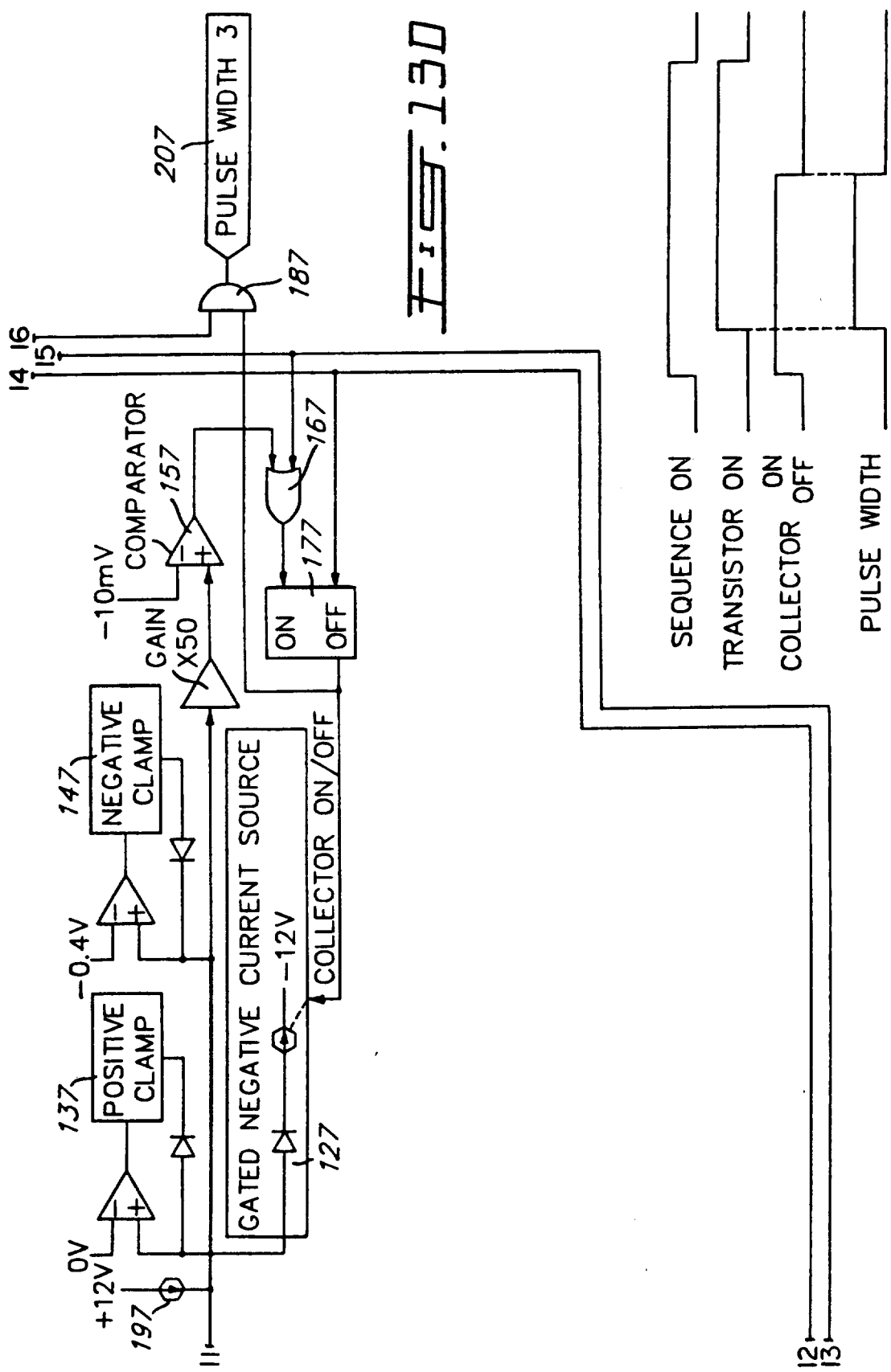

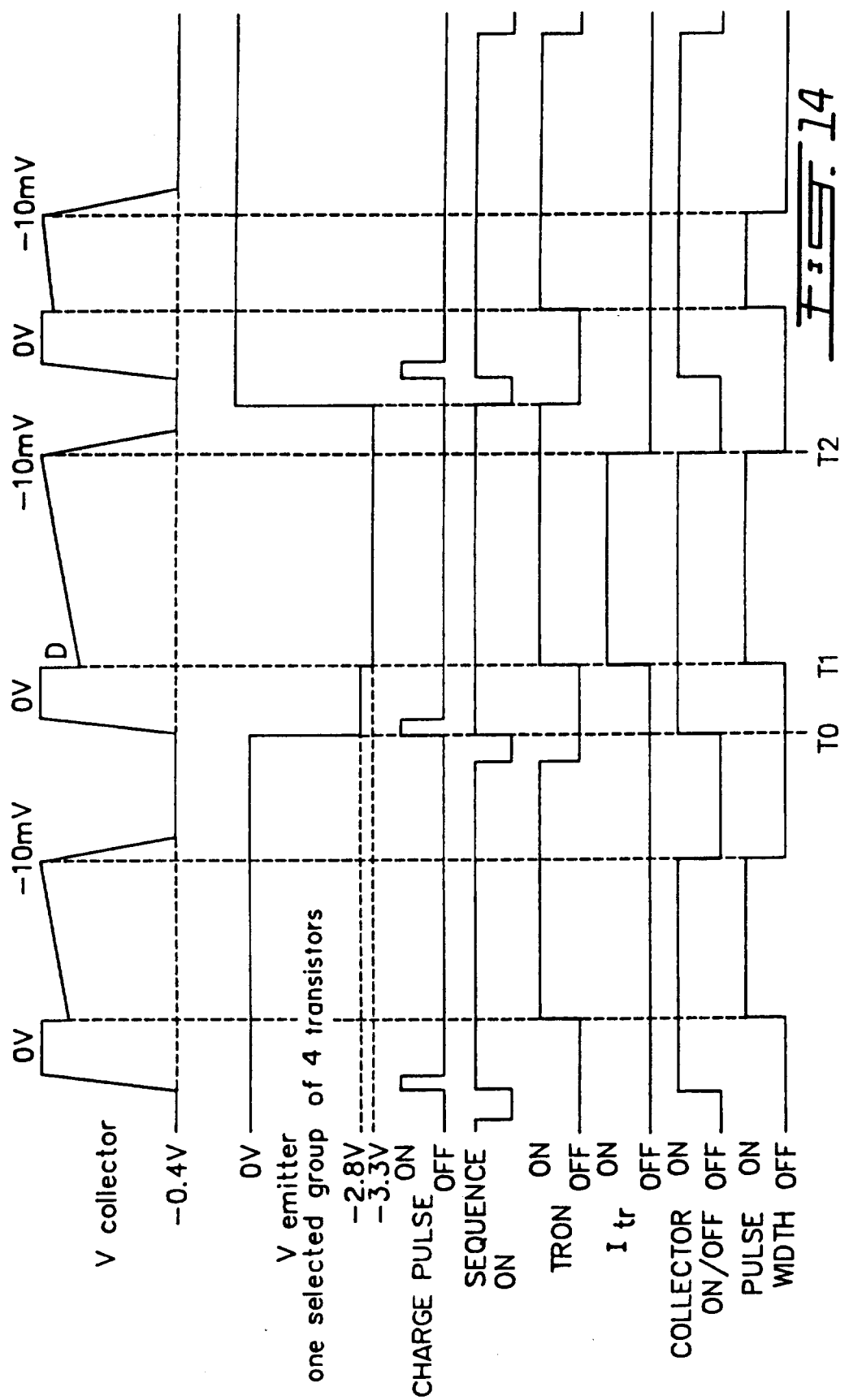

X-RAY SENSOR ARRAYS

This is a divisional of co-pending application Ser. No. 503,884 filed on Apr. 3, 1990.

BACKGROUND OF INVENTION

1. Field of the Invention

The invention relates generally to X-ray sensor arrays which comprise a plurality of sensor elements forming the arrays. More specifically, the invention relates to a novel method and circuit arrangement for measuring the intensity of the light falling on the sensor elements. The invention also relates to a novel and advantageous configuration of sensor elements for forming such a sensor array.

2. Description of Prior Art

Sensor arrays for X-ray detection or other uses are already known in the art. For example, U.S. Pat. No. 4,064,440, Roder, Dec. 20, 1977, U.S. Pat. No. 4,430,563, Yoshida et al, Feb. 7, 1984, U.S. Pat. No. 4,426,721, Wang, Jan. 17, 1984, U.S. Pat. No. 4,535,243, Peschmann, Aug. 13, 1985, U.S. Pat. No. Re. 32,164, Kruger, May 27, 1986, U.S. Pat. No. 4,153,839, Hounsfield et al, May 8, 1979, U.S. Pat. No. 3,937,965, Vasseur, Feb. 10, 1976 and U.S. Pat. No. 4,075,492, Boyd et al, Feb. 21, 1978, teach linear arrays of photosensitive elements.

U.S. Pat. No. 4,181,856, Bone, Jan. 1, 1980, teaches a sensor array comprising scintillator crystals and photodiodes which are mounted in assemblies of sub-arrays of, for example, four units. The mountings are shaped to permit a complete assembly in the form of a ring.

U.S. Pat. No. 4,542,519, Sugimoto, Sep. 17, 1985, teaches a sensor array comprising alernating scintillation crystals and photoelectric transducers optically coupled. The outputs of the photoelectric transducers are fed to integrating amplifiers.

U.S. Pat. No. 4,504,962 teaches a switching arrangement for combining the outputs of two, four, eight . . . adjacent detectors, or for using the outputs of each detector individually. The output of each sensor in a sensor array as taught in U.S. Pat. No. 4,583,240, Gatten et al, Apr. 15, 1986 is fed to a track and hold circuit arrangement which includes a voltage follower transistor and resistor, a Butterworth filter, a transconductance amplifier including a charging capacitor, and an analog-to-digital converter.

In U.S. Pat. No. 4,484,340, Yamaguchi et al, Nov. 20, 1984, the output of sensors $I_1, I_2 \ldots I_n$ are fed, one at a time, to amplifier U through switches $S_1, S_2 \ldots S_n$ respectively. Reset switch, $S_r$, across the input of amplifier U, discharges distributed capacitance $C_x$ across the input of the amplifier.

U.S. Pat. No. 4,366,382, Kotowski, Dec. 28, 1982, teaches a linear array of photodetectors. To measure the intensity of light falling on the photodetectors, a separate integrating amplifier is required for each photodetector. Canadian Patent 1,090,482, Beland, Nov. 25, 1980, teaches a linear array of phototransistors as sensor elements for sensing the light intensity falling on the phototransistors. As explained with respect to FIGS. 4A, 4B and 4C of the patent, the intensity of the light falling on the phototransistor is measured by measuring charging current. Both the '382 patent and the '482 patent teach linear arrays of sensors.

In the prior art, the measurement methods and circuits for measuring the intensity of light falling on the sensors is typically complex and requires a large number of parts. Accordingly, the reliability of the measurement circuit is necessarily low. For example, in the '382 patent, a separate amplifier is required for each sensor.

In addition, except for the '490 patent, the prior art does no address itself to the question of density of sensors in an array. Obviously, the greater the density, the better will be the image detected by the array.

SUMMARY OF INVENTION

It is therefore an object of the invention to provide a novel method and circuit arrangement for measuring the intensity of light falling on the sensors of an X-ray sensor array.

It is a further object of the invention to provide a high density such array.

In accordance with the invention an X-ray sensor comprises a plurality of phototransistors arranged in a matrix of n columns and m rows whereby each row comprises n phototransistors and each column comprises m phototransistors. Each phototransistor comprises a first electrode, a second electrode and a third electrode and includes an interelectrode capacitance between the second electrode and the third electrode. The first electrodes of each phototransistor in each row are connected to a common connector for that row, and the second electrodes of each phototransistor in each column are connected to a common connector for that column. A first biasing source is provided to turn the phototransistors ON when connected to the first electrode thereof, and a second biasing source is provided to turn the phototransistors OFF when connected to the second electrode thereof First means are provided for connecting the first biasing source to the common connectors of the rows one row at a time and for a predetermined period, and second means are provided for connecting the second biasing source to the common connectors of the columns one column at a time. Thus, when light energy falls on the phototransistors, the interelectrode capacitance will be discharged from a first level to a second level. Means are provided for charging the discharged interelectrode capacitance back to the first level.

In accordance with the invention, there is also provided an X-ray sensor array comprising a plurality of phototransistors and a circuit board for mounting the plurality of phototransistors, the circuit board being in the shape of a parallelepiped. The phototransistors are mounted in two rows on either side of the longitudinal center line of the circuit board, the lines being equally spaced from the center line. The phototransistors are arranged in groups of four on the circuit board such that two phototransistors of the group of four phototransistors are mounted on one side of the center line and the remaining two phototransistors of the group of four phototransistors are mounted on the other side of the center line. The two phototransistors on the one side of the center line are offset with respect to the two phototransistors on the other side of the center line.

BRIEF DESCRIPTION OF DRAWINGS

The invention will be better understood by an examination of the following description, together with the accompanying drawings, in which:

FIG. 3 is a graph useful in explaining the operation of the phototransistor illustrated in FIG. 2;

FIG. 6 is a physical configuration of a sensor array in accordance with the invention;

FIG. 7 is a graph useful in explaining the operation of the invention;

FIG. 11 is a graph useful in explaining the operation of the biasing arrangements of FIGS. 9 and 10;

FIGS. 13A-13D are an automatic biasing and measurement circuit for use with a matrix as illustrated in FIG. 5; and FIG. 14 is a timing diagram of the circuit in FIG. 13.

DESCRIPTION OF PREFERRED EMBODIMENTS

Figure 1:
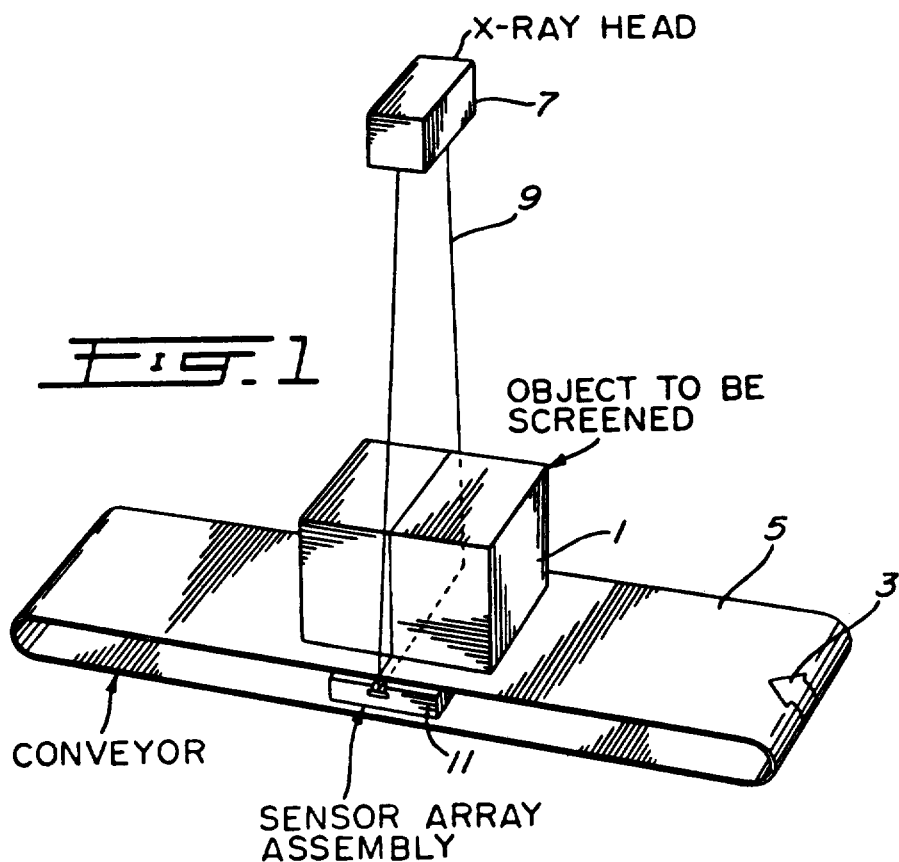
FIG. 1 is a schematic perspective view of an X-ray inspection system.

An X-ray inspection system is generally illustrated in FIG. 1 wherein an object 1 to be screened is moved in the direction of the arrow 3 by a conveyor belt 5. An X-ray head 7 transmits an X-ray beam 9 which passes through the object 1 to be screened. The X-ray beam excites the sensor array assembly 11 which may, as described in Canadian Patent 1,090,482, comprise an array of sensor elements covered by a fluorescent screen. The X-ray beam will excite the fluorescent screen to give off light whose intensity is proportional to the intensity of the X-ray beam at that point.

As is well known in the art, if the interior of the object to be screened does not include any materials which impede the passage of the X-ray beam, then the X-ray beam will emerge on the bottom of the object 1 to be screened at full strength. If, on the other hand, the object 1 to be screened does contain a material which will impede the passage of the X-ray beam, then a weakened X-ray beam, or no X-ray beam at all, will emerge at the bottom of the object 1 to be screened.

The sensor array of the present application is useful for a system as illustrated in FIG. 1. Alternatively, it is also useful for sensing X-rays in medical systems, for example, the tomography systems also referred to in the above-mentioned references.

As is well known in the art, the sensor array for sensing the emitted light from the fluorescent screen may consist of photodetecting devices, for example, phototransistors. In order to be able to measure the very low light levels radiated by the fluorescent screens associated with the detection of X-rays, it is mandatory to reduce the interference of the phototransistor to as low a level as possible. In accordance with a current technique, the visible light radiated by the fluorescent screen is integrated by the base collector junction of the phototransistor during a predetermined time period (for example 20 msec). Then, during a relatively shorter period of time (for example 200 μsec) the magnitude of the integrated voltage is measured. The phototransistor is then replaced to its initial condition by external circuitry.

Figure 2:
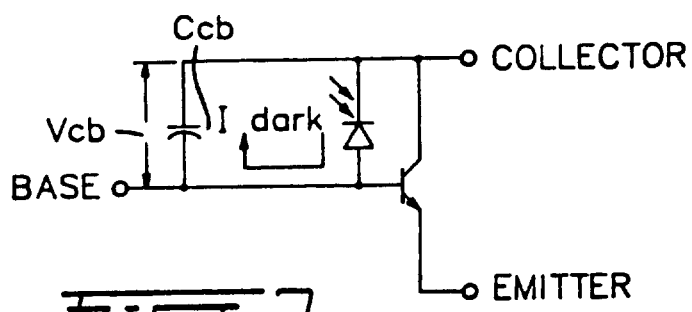
FIG. 2 is a schematic diagram of a phototransistor illustrating interelectrode capacitance and dark current effect.

To understand the inventive method of the present application, attention is directed to FIGS. 2 and 3 hereof. The phototransistors used for photodetection all include the common feature of a junction capacitance between the base and the collector which is larger than the similar junction capacitance for a normal transistor. It is the base-collector junction of the phototransistor which is sensitive to light. The base-collector capacitance is illustrated in FIG. 2 as $C_{cb}$.

This capacitance will be discharged by light falling on it from the fluorescent screen, and will be recharged by an external circuit, in the case of the inventive method, the measurement circuit. Even when no light falls on the phototransistor, there still exists a dark current, $I_{dark}$, which will discharge the capacitance. The latter is the leakage current between the collector and the base.

During normal operation, the operation of the phototransistor is cyclic as illustrated in FIG. 3 which shows a graph of base-collector voltage against time. During the integration period, the phototransistor is cut off. This is because the very small current generated by the light must be all used to discharge the junction capacitance $C_{cb}$; consequently, any leakage current outside the phototransistor cannot be tolerated during that time.

During the measurement period ($T_m$), the junction is recharged to its initial condition using, for example, a constant current source. The time that it takes the current source to charge the junction capacitance to its initial condition is a function of the amount of light energy falling on the phototransistor from the fluorescent screen. Thus, in order to measure light energy, it is sufficient to measure charging time. Alternatively, the voltage $V_{int}$ may be measured for the same purpose.

Figure 4:
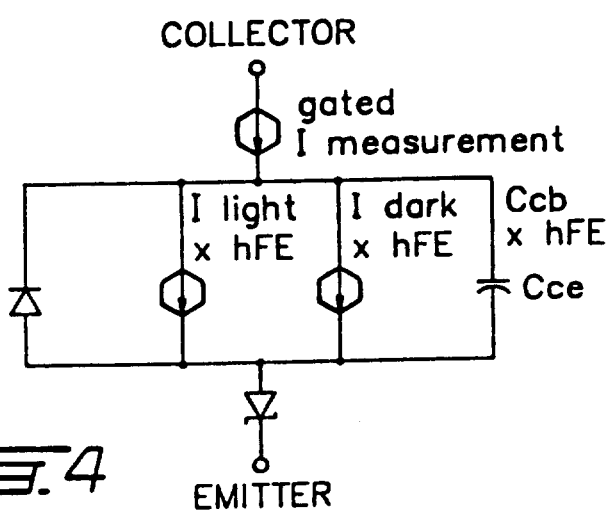
FIG. 4 is an equivalent circuit model of the phototransistor in FIG. 2.

The phototransistor operation can also be analyzed using an equivalent circuit model as illustrated in FIG. 4. An examination of FIG. 4 indicates that the following equations are a close enough approximation of the operation of the phototransistor to validate measurements of the inventive system, i.e., to provide a system which works:

$$I_t = (I_1 + I_d) \times h_{FE} \quad (1)$$

$$C_{ce} = C_{cb} \times h_{FE} \quad (2)$$

$$V_{int} = \frac{\int I_t \times dt}{C_{ce}} = \frac{h_{FE} \times \int (I_1 + I_d) \times dt}{h_{FE} \times C_{cb}} = \frac{\int (I_1 + I_d) \times dt}{C_{cb}} \quad (3)$$

$$T_m = \frac{C_{ce} \times V_{int}}{I_m} = \frac{h_{FE} \times C_{cb} \times V_{int}}{I_m} = \frac{h_{FE} \times \int (I_1 + I_d) \times dt}{I_m} \quad (4)$$

where:

$I_t$ = equivalent collector-emitter capacitance discharging current
$I_1$ = collector-base junction light discharging current
$I_d$ = collector-base junction dark discharging current
$I_m$ = measurement current
$h_{FE}$ = DC current gain of the phototransistor
$C_{ce}$ = equivalent collector-emitter capacitance $C_{cb}$ = collector-base junction capacitance
$V_{int}$ = integration time voltage variation
$T_m$ = measured time.

Considering the above equations, it can be seen that the integration voltage is independent of the gain hFE of the transistor, but that the measurement period is directly proportional to hFE.

Figure 5:
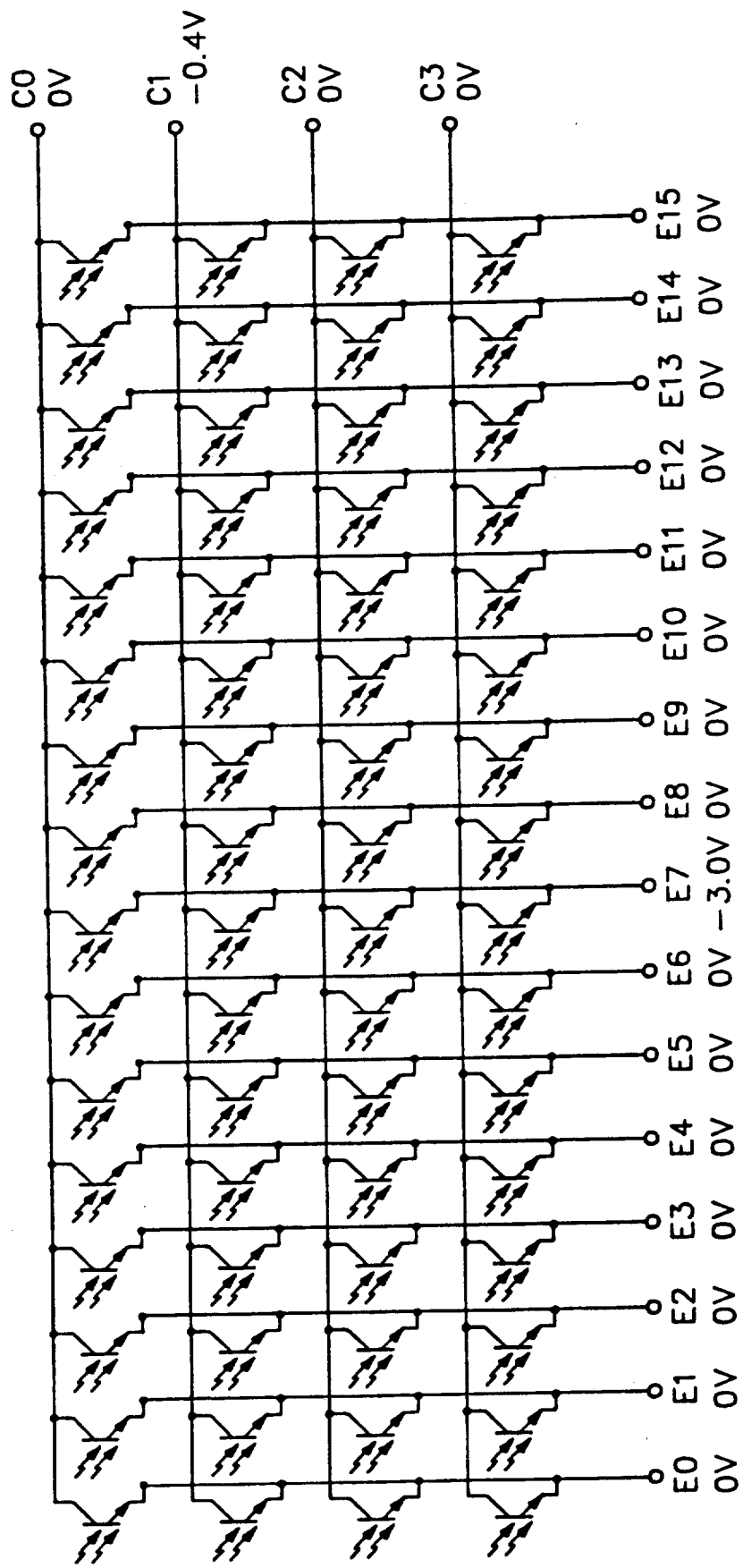
FIG. 5 illustrates a matrix configuration for a plurality of phototransistors.

An example of a circuit topology of a phototransistor array is illustrated in FIG. 5. As can be seen, the array in FIG. 5 is in matrix configuration and includes sixty-four phototransistors connected to four lines of common collector and sixteen lines of common emitter. This permits a greater density of phototransistors using a standard I.C. pin-out (24 pins —see FIG. 6).

Referring to FIG. 6, there is illustrated an hybrid circuit module 16 for mounting the array. The hybrid circuit module includes twenty-four pins 18, twenty of these pins are connected to the array arrangement. (See below).

The phototransistors 17 are connected in groups of four, and the emitters of each group of four are connected to a common bus 19. The collector connections are on a thick film inner layer on the hybrid module ceramic substrate and are therefore not shown in FIG. 6.

Each bus 19 would be connected to a separate pin 18, and each collector bus would also be connected to a separate pin 18. This would use up a total of twenty pins of the twenty-four pin hybrid circuit module.

The phototransistors are mounted equally spaced on two adjacent lines, and one example of the spacing dimensions as well as the size of the board are given in FIG. 6. The arrangement as illustrated in FIG. 6 permits a high density of phototransistors in the given space. The board is in parallelepiped form with the ends cut on a bias of 70°. This permits several hybrid circuit modules to be mounted in the series without losing the spacing between the phototransistors.

Because the phototransistors are arranged in a matrix configuration, circuitry for applying bias and for taking readings must be arranged in a special multiplex configuration as will be seen below. In all cases, it must be ensured that each phototransistor is cut-off during its integration period.

Considering once again $V_{cb}$ versus time graph, as illustrated in FIG. 7, it can be seen that the magnitude of current which must be supplied to recharge the phototransistor is a function of the extent of integration (i.e., the intensity of the light energy falling on the phototransistor). Because of the matrix configuration as above-illustrated, of four common collectors and sixteen common emitters, the four phototransistors connected to a common emitter line must be turned ON at the same time. The current sources charging the phototransistors will also be turned ON at the same time, however, they will be turned OFF at a different time. Thus, the current source providing the current $I_{c2}$ must be ON for a longer time than the current source providing the current $I_{c1}$ in FIG. 7. Alternatively, and as in the embodiment below, the current source, connected to all collectors in a column, is always ON. However, current will not flow through the phototransistors which are turned OFF, so that only the collector-emitter capacitance of the phototransistors which are turned ON will be charged by the current source.

The integration period, and the integration time, will be the same for all phototransistors. The measurement period will be large enough to permit full recharging with any transistor with the highest level of light, that is, with the maximum integrated voltage variation. The measurement time will, of course, be a function of the integration level to which the phototransisror falls as a result of the extent of light energy falling on that phototransistor.

It will therefore be necessary to find a configuration which permits the individual cut-off of each transistor in a group of four, all of which have their emitters connected to a common bus. Obviously, the configuration will require that each individual phototransistor be cut off by applying a bias to the collector of the phototransistor.

Figure 8:
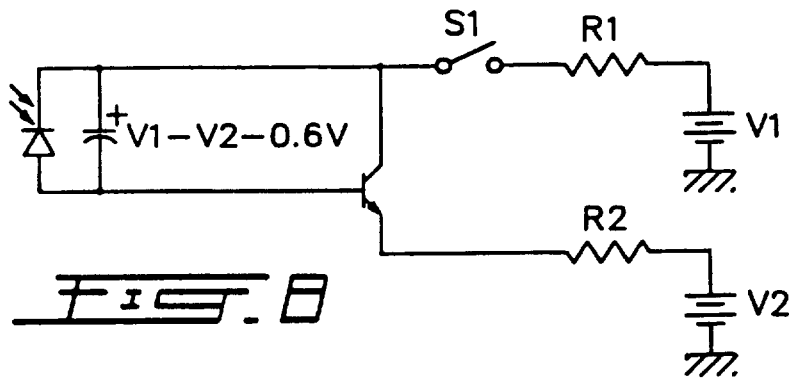
FIG. 8 illustrates a biasing arrangement for the phototransistor.

Considering FIG. 8, at time T=0, (S1 is closed), $V_{cb} = V1 - V2 - 0.6$ V. To put the phototransistor in its cut-off condition, we may either open the mechanical switch S1 or force a voltage between the emitter and collector which is less than $V1 - V2$. When the mechanical switch S1 is open, no current can flow in the collector terminal. However, because of the speed of the reading, we cannot use a mechanical switch or relay in a practical embodiment. Although a solid state analog switch could be used, because the magnitude of the measurement current is so small (typically 1 ua), the parasitic capacitance of the switch would prevent the circuit from working properly. When forcing the voltage, because of the stored charge between the base and the collector, the base-emitter junction will no longer be biased.

Figure 9:
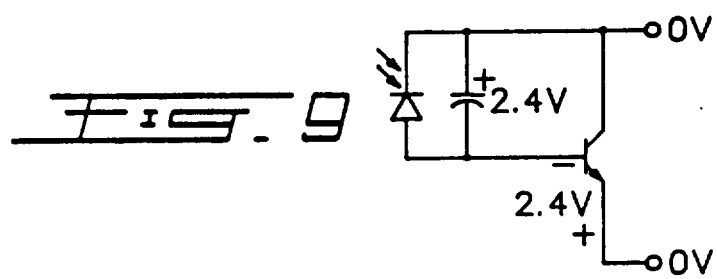
FIG. 9 illustrates a second biasing arrangement for the phototransistor.
Figure 10:
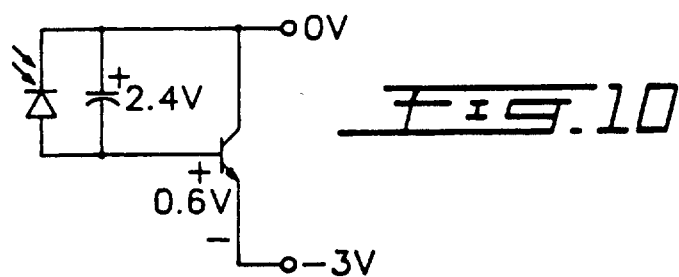
FIG. 10 illustrates a still further biasing arrangement for the phototransistor.

One possible practical technique is illustrated in FIGS. 9, 10 and 11. During the integration period, as illustrated in FIG. 9, the voltage at both the emitter and the collector is approximately 0 volt. Thus the base-emitter junction is reverse-biased with a voltage of approximately 2.4 volts. To turn the transistor ON, a $-3.3$ volt bias would be applied to the emitter. The reason for the $-3.3$ volt bias is that it is desirable to read the transistor when it is operating in its linear mode. However, we do not wish to have this bias go beyond the breakdown voltage of the base-emitter junction, i.e., approximately 5 to 7 volts.

In actual practice, to turn the transistor ON, the transistor is not driven directly to $-3.3$ volts. Instead, it is driven first to a voltage close to turn ON, for example, $-2.8$ volts, and permitted to stabilize at the $-2.8$ level before applying a bias of $-3.3$ volts.

Figure 12:
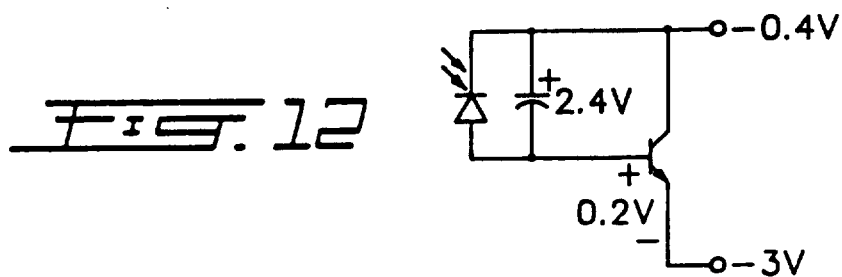
FIG. 12 illustrates a preferred biasing arrangement in accordance with the invention.

However, in the above-described proposal, we have the problem of being unable to change the emitter voltage in a group without changing the emitter voltage of all other phototransistors in that same group. Accordingly, we would adopt the process of applying the cut-off bias voltage to the collector as illustrated in FIG. 12. In this particular case, it is proposed to provide a bias voltage of $-0.4$ V.

Returning to FIG. 5, it can be seen that when the collector of one phototransistor is reduced to $-0.4$ V, the collector of fifteen other phototransistors will be reduced by the same amount. We therefore have to consider this effect.

Suppose in FIG. 5 we wish to cut off the phototransistor at the junction of E7 and C1, we would apply $-0.4$ volt to the line of phototransistors whose collectors are connected to C1. The emitters of all of these phototransistors would be at 0 volts. Accordingly, the cutting off of these transistors is accentuated which would meet with the requirements of the present arrangement.

Recapitulating then, a group of four transistors would be turned ON by applying −3.3 volts at their common emitter terminal. Each transistor of the group would be turned OFF by applying −0.4 volts to its collector terminal.

Figure 13A:
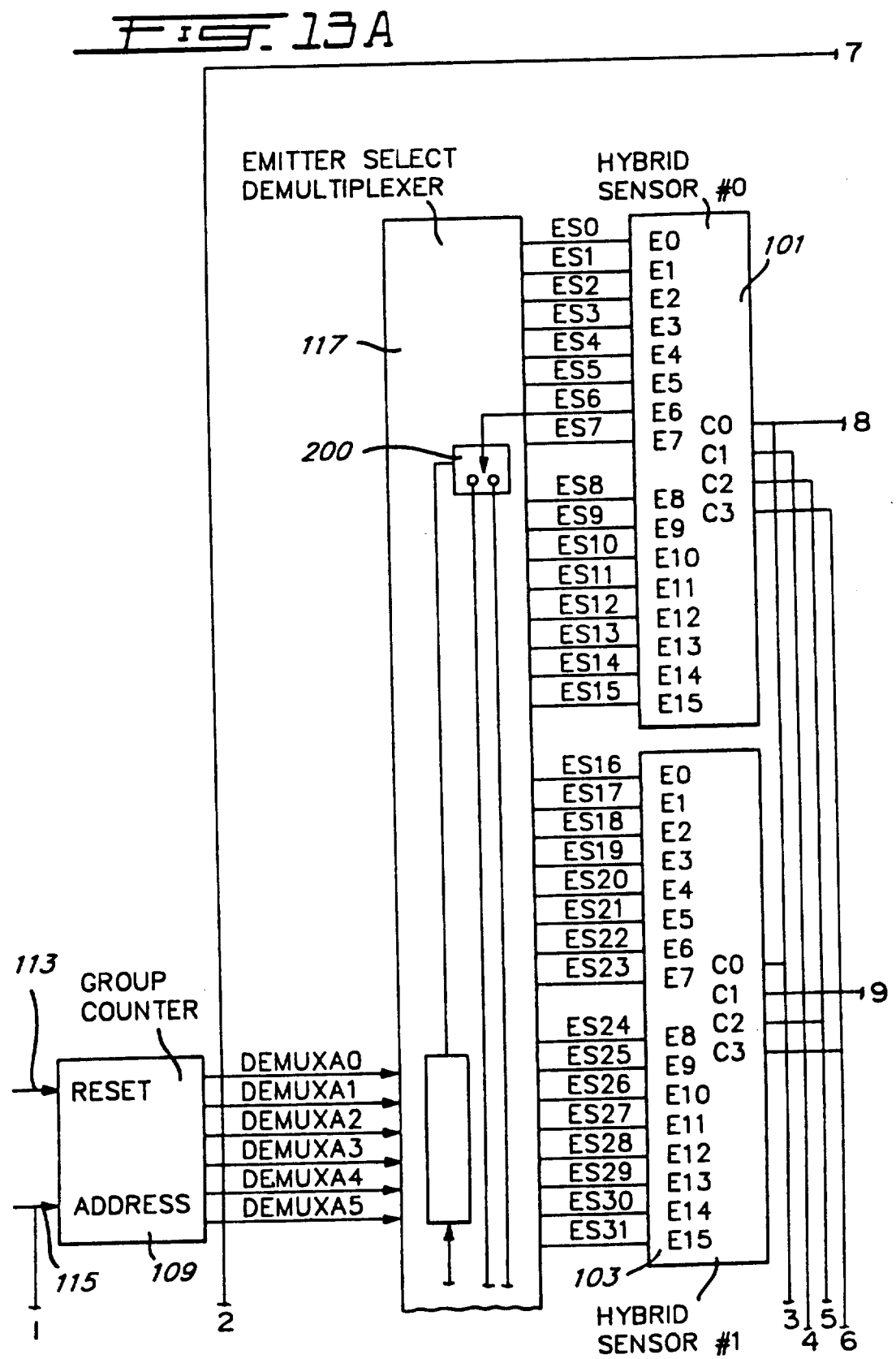
Figure 13B:
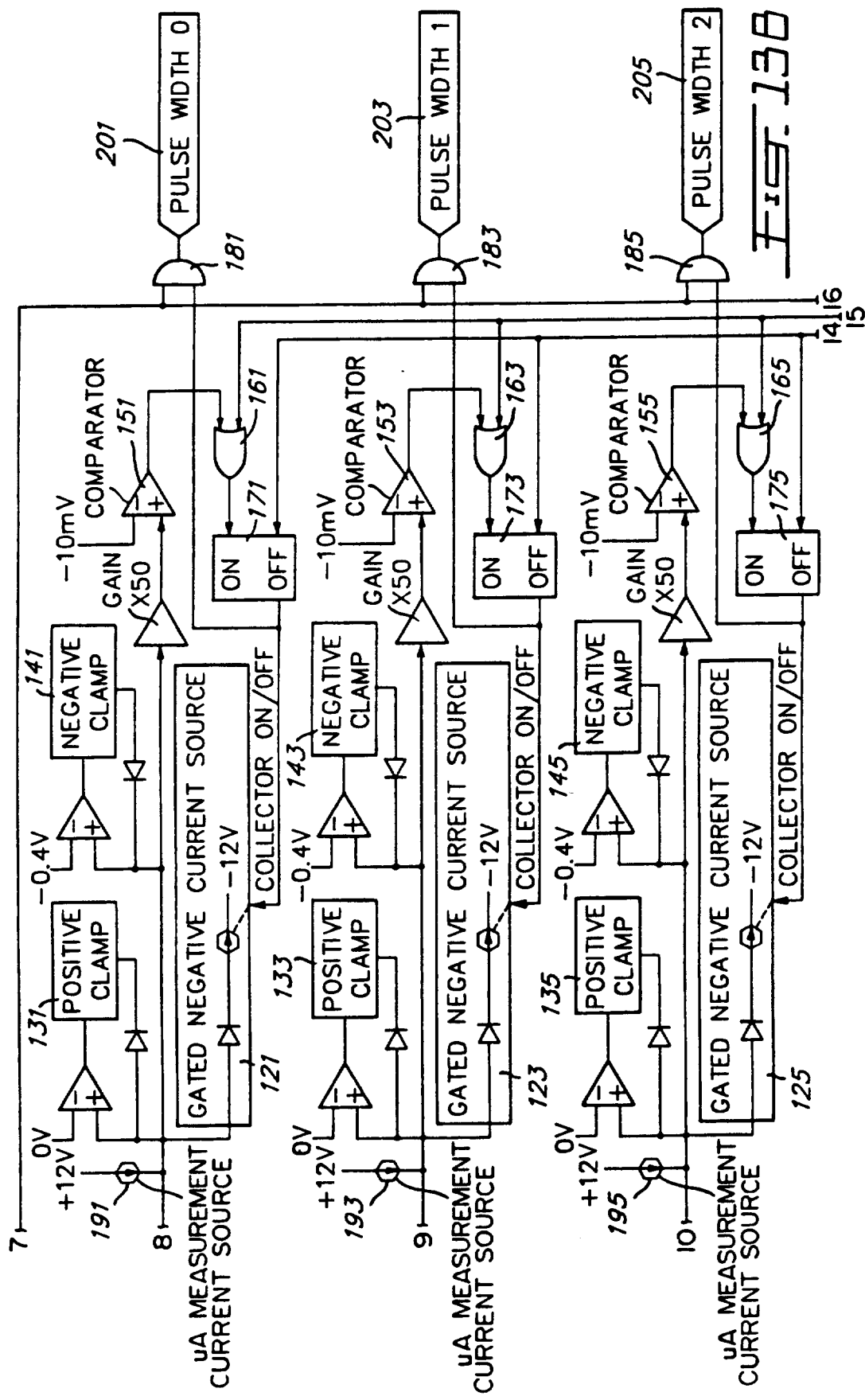
Figure 13C:
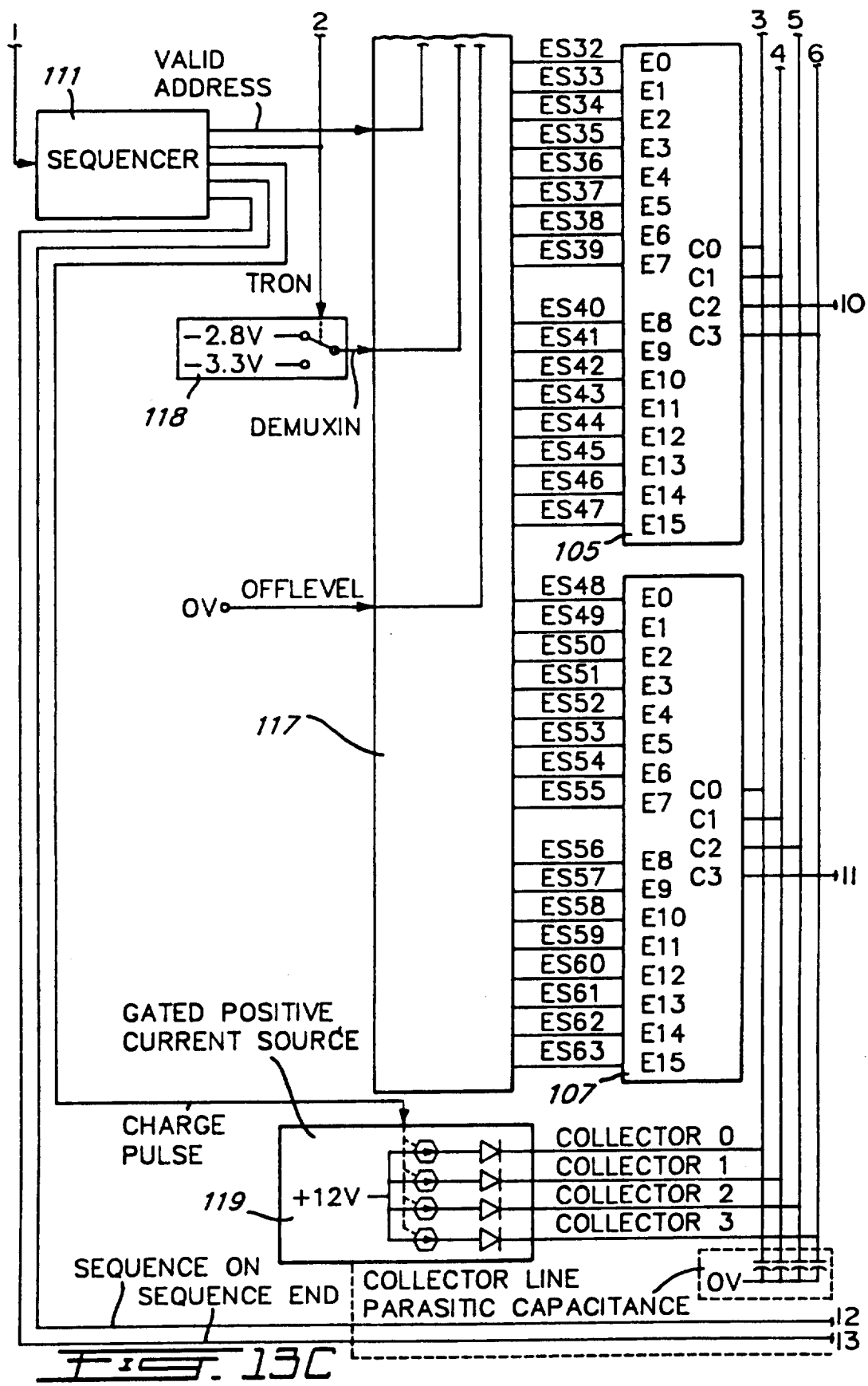

Keeping the above in mind, attention is directed to FIG. 13 which illustrates an arrangement for setting the bias voltages and for taking measurements. In FIG. 13, the sensor array comprises four hybrid circuit modules, 101, 103, 105 and 107 each of the type illustrated in FIGS. 5 and 6 herein. Each hybrid circuit module contains 64 phototransistors having four common collector lines and sixteen common emitter lines.

The arrangement comprises a group counter 109 and a sequencer 111. The reset terminal of the group counter 109 is fed from a group of LINE SYNC pulses 113, and the address terminal of the group counter 109 is fed from a source of GROUP SYNC pulses 115. The sequencer 111 is also fed from the source of GROUP SYNC pulses 115.

The output of group counter 109 is fed to the multiplexer 117, while one output of the sequencer 111 controls the operation of an emitter voltage supply 118. Another output of the sequencer controls the operation of gated positive current source 119. As can be seen, the output of 119 is fed to all of the common collector buses.

A separate one of gated negative current sources 121, 123, 125 or 127 is connected to a separate one of the common collector buses. Thus, gated negative current source 121 is associated with common collector bus C0, gated negative current source 123 is associated with common collector bus C1, gated negative current source 125 is associated with common collector bus C2 and gated negative current source 127 is associated with common collector bus C3. A separate positive clamp 131, 133, 135 or 137 is connected to a separate common collector bus as is a separate negative clamp 141, 143, 145 or 147. In the same way, a separate comparator 151, 153, 155 or 157, a separate OR gate, 161, 163, 165 or 167 and a separate flip-flop, 171, 173, 175 or 177 is associated with a separate common collector bus, C0, C1, C2 or C3 respectively. Timers 181, 183, 185 and 187 are respectively connected to the outputs of 171, 173, 175 and 177.

In considering the operation of the arrangement in FIG. 13, attention is directed to FIGS. 13 and 14. The common emitter buses E0 to E15 on each board 101, 103, 105 and 107 will be connected to the OFF level voltage (0 volts) except for the common emitter bus at a selected address. For this purpose, a switch, of the type illustrated schematically at 200, is associated with each line ES0 to ES63. The switches, except for the switch at a selected address, will be connected to terminal A thereof so that each of the common emitter buses are connected to 0 volts. All of the phototransistors whose emitters are connected to 0 volts will, as above discussed, be turned OFF so that they will be in the integrating mode.

The group counter 109 comprises an address resetter. On receipt of a pulse from the source of LINE SYNC pulses 113, the address of 109 will be reset to ES0. On receipt of each pulse from the source of GROUP SYNC pulses, the address is advanced by 1 (e.g., from ES5 to ES6 . . . from ES22 to ES23 . . . from ES54 to ES55 . . . etc.). Thus, a different group of four phototransistors, connected to the common emitter bus of the selected address, will be in the measurement mode when the GROUP SYNC pulse selects the address of the common emitter bus of the four phototransistors.

The output of the source of GROUP SYNC pulses 115 is also sent to the sequencer 111. On receipt of each pulse, the SEQUENCE ON signal is activated and the valid address line of the sequencer will connect the common emitter bus at the new address from the A terminal of switch B to the B terminal thereof, that is, to emitter bias voltage source 118. This will occur at time T0 in FIG. 14. As can be seen, at that time, the emitters of the selected phototransistors fall to −2.8 volts.

At the same time, the sequencer will provide a charge pulse to gated positive current source 119 because of the collector line capacitance and to quickly drive the collectors at all phototransistors on the four hybrid circuit modules to 0 volts. The SEQUENCE ON signal is fed from the sequencer to the ON terminal of flip-flops 171, 173, 175 and 177, to activate the gated negative current sources 121, 123, 125 and 127 respectively to thereby clamp all of the collectors to 0 volts by the action of positive clamps 131, 133, 135 and 137 respectively. The output of flip-flops 171, 173, 175 and 177 are also fed to AND gates 181, 183, 185 and 187 where they are ANDed with the common signals TRON (see below) to give the PULSE WIDTH outputs 201, 203, 205 and 207.

At some time after the SEQUENCE ON pulse, the output of emitter bias voltage source 118 is lowered to −3.3 volts by the action of the TRON line from the sequencer 101. This will turn the phototransistors at the selected address ON which will cause the collector voltage to drop by an amount D as shown in FIG. 14. The amount D is a function of the integrated voltage variation on the base-collector junction of the transistor, i.e., the greater the level of integration, the greater will be the drop D.

Current will now be fed to the respective collectors of the phototransistors, through their common collector buses, at the selected address from constant current sources 191, 193, 195 and 197. As a result, the voltage on the collectors of the phototransistors at the selected address will begin to rise in ramp form as seen in FIG. 14. When the collectors reach a level of −10 millivolts/50, then the output of the respective comparators 151, 153, 155 and 157 will provide an input signal to OR gates 161, 163, 165 or 167 respectively which, in turn, will be fed to the OFF terminals of flip-flops 171, 173, 175 or 177 respectively. The voltage at the respective collectors will reach the critical values at different times depending on the extent of the integrated voltage on the base-collector junction of each phototransistor.

When the OFF terminals of flip-flops 171, 173, 175 and 177 receive an input at their OFF terminals, respective gated negative current sources 121, 123, 125 and 127 will be initiated to clamp the respective collector voltage at −0.4 volts by the action of negative clamps 141, 143, 145 or 147 to turn OFF that respective phototransistor. This will begin at time T2 in FIG. 14, and the interval between T1 and T2 is representative of the amount of light which has fallen on the respective phototransistor.

If the voltage on the collector terminal does not reach −10 millivolts/50 within the measurement cycle time, then a signal on the Sequence End line of the sequencer will terminate the measurement cycle. At the same time that the Sequence End signal is sent out of the sequencer, the TRON line will return the emitter bias voltage source 118 from −3.3 volts to −2.8 volts.

Shortly after the sequence end pulse, a next GROUP SYNC pulse will be received from the source of GROUP SYNC pulses 115 to initiate the measurement cycle on the four phototransistors connected to the common emitter bus at the next selected address.

Although a single embodiment has been above-described, this was for the purpose of illustrating, but not limiting, the invention. Various modifications, which will come readily to the mind of one skilled in the art, are within the scope of the invention as defined in the appended claims.

We claim,

1. An X-ray sensor array comprising:

a plurality of phototransistors;

a hybrid circuit module for mounting said plurality of phototransistors, said hybrid circuit module being in the shape of a parallelepiped;

said phototransistors being mounted in two rows on either side of the longitudinal center line of said hybrid circuit module, said rows being equally spaced from said center line;

said phototransistors being arranged in groups of four on said hybrid circuit of four phototransistors are mounted on one side of said center line and the remaining two phototransistors of said group of four phototransistors are mounted on the other side of said center line;

said two phototransistors on said one side of said center line being offset with respect to said two phototransistors on said other side of said center line.

2. An X-ray sensor array as defined in claim 1 wherein the emitters of each group of four phototransistors are connected to a respective common emitter bus.

3. An X-ray sensor array as defined in claim 2 wherein each group of phototransistors comprises a first phototransistor, a second phototransistor, a third phototransistor and a fourth phototransistor;

the collectors of said first phototransistors of all of said groups being connected to a common collector bus;

the collectors of the second phototransistors of all of said groups being connected to a common collector bus;

the collectors of the third phototransistors of all of said groups being connected to a common collector bus;

the collectors of the fourth phototransistors of all of said groups being connected to a common collector bus.

4. An X-ray sensor array as defined in claim 3 wherein said hybrid circuit module comprises a four-sided parallelogram;

the ends parallel of the parallelogram being at an angle of 70 degrees to the sides thereof.

* * * * *

UNITED STATES PATENT AND TRADEMARK OFFICE
CERTIFICATE OF CORRECTION

PATENT NO. : 5,140,395

DATED : August 18, 1992

INVENTOR(S) : Robert Beland and Yves Chartier

It is certified that error appears in the above-identified patent and that said Letters Patent is hereby corrected as shown below:

Column 9, line 24, after "circuit" insert --module such that two phototransistors of said group--.

Signed and Sealed this

Eighteenth Day of January, 1994

Attest:

BRUCE LEHMAN

*Attesting Officer*    *Commissioner of Patents and Trademarks*